United States Patent [19]
Ishizuka

[11] Patent Number: 5,717,600
[45] Date of Patent: Feb. 10, 1998

[54] METHOD FOR DESIGNING AN INTERCONNECTION ROUTE IN AN LSI

[75] Inventor: Akio Ishizuka, Tokyo, Japan

[73] Assignee: NEC Corporation, Tokyo, Japan

[21] Appl. No.: 667,482

[22] Filed: Jun. 24, 1996

Related U.S. Application Data

[63] Continuation of Ser. No. 351,071, Nov. 30, 1994, abandoned.

[30] Foreign Application Priority Data

Dec. 1, 1993 [JP] Japan .................. 5-301398

[51] Int. Cl.$^6$ ...................................... G06F 15/00
[52] U.S. Cl. .................. 364/491; 364/488; 364/489; 364/490
[58] Field of Search ........................ 364/488–491

[56] References Cited

U.S. PATENT DOCUMENTS

| | | | |
|---|---|---|---|
| 3,681,782 | 8/1972 | Scanlon | 444/1 |
| 3,702,003 | 10/1972 | Ramirez, Jr. et al. | 444/1 |
| 3,702,004 | 10/1972 | Eskew et al. | 444/1 |
| 4,495,559 | 1/1985 | Gelatt, Jr. et al. | 364/148 |
| 4,615,011 | 9/1986 | Linsker | 364/491 |
| 4,636,965 | 1/1987 | Smith et al. | 364/491 |
| 4,754,408 | 6/1988 | Carpenter et al. | 364/491 |
| 5,309,370 | 5/1994 | Wong | 364/490 |
| 5,315,535 | 5/1994 | Kikuchi et al. | 364/489 |
| 5,361,214 | 11/1994 | Aoki | 364/490 |

OTHER PUBLICATIONS

Wiley et al. "M3D: A Multidimensional Dynamic Configurable Router," IEEE, 1993, pp. 1857–1860.

Lienig et al. "Routing Algorithms for Multi–Chip Modules," IEEE, 1992, pp. 286–291.

Youn–Long Lin et al., "Silk: A Simulated Evolution Router", IEEE Transactions on Computer–Aided Design, vol. 8, No. 10, Oct. 1989, pp. 1108–1114.

Hyunchul Shin et al., "A Detailed Router Based on Incremental Routing Modifications: Mighty", IEEE Transactions on Computer–Aided Design, vol. CAD–6, No. 6, Nov. 1987, pp. 942–955.

*Primary Examiner*—Kevin J. Teska
*Assistant Examiner*—Vuthe Siek
*Attorney, Agent, or Firm*—Foley & Lardner

[57] ABSTRACT

A method for designing an interconnection route in an LSI includes steps of finding a minimum-cost path among possible paths for a current net, the possible paths overlapping with existing nets routed before the current net. A unit cost assigned to a grid for scoring possible paths includes a length cost and a rip-up and reroute cost for ripping-up and rerouting the existing nets overlapping with the current net in the grid. The rip-up and reroute cost is not scored, however, when the existing nets also overlaps with the current net in another grid so far routed. The route will be possibly selected in a path overlapping with a several wire segments of a single existing net rather than overlapping with a single segment of each of a plurality of existing nets. Number of rip-up and reroute procedure is reduced so that the speed of routing process is improved, providing a lower cost for routing an interconnection route in a computer.

8 Claims, 5 Drawing Sheets

METHOD FOR DESIGNING AN INTERCONNECTION ROUTE IN AN LSI

This application is a continuation of application Ser. No. 08/351,071, filed Nov. 30, 1994, now abandoned.

BACKGROUND OF THE INVENTION (a) Field of the Invention

The present invention relates to a method for designing an interconnection route in an LSI and, more particularly, to a method for designing an interconnection route in an LSI using rip-up and reroute operation of preceding routed nets.

(b) Description of the Related Art

There have been two routing techniques, for a large scale integrated circuit, including one in which a plurality of interconnections or nets are routed collectively at a time in a separated routing area and the other in which nets are routed in a whole routing area one by one. The present invention relates to the latter, in which rip-up and reroute operations are introduced for rerouting a preceding routed net already routed in a routing area.

The rip-up and reroute technique is generally used in a maze method. In the maze method, a routing area of an LSI is generally represented by a matrix of a plurality of grids each obtained as one of intersections of a plurality of vertical or column tracks and a plurality of horizontal or row tracks. Each of the grids can receive a wire segment of a single net. If a grid is occupied by a wire segment of an existing net routed before the routing of a current net under routing, the grid retains data for inhibiting a path for the current net.

In a practical routing process, nets are generally routed one at a time in a routing area. If a current net is unable to run in an optimal path due to the presence of an existing net, rip-up and reroute approach is employed for removing the existing net. Before rip-up and reroute operation of the existing net, the current net has a score to evaluate a quality of routing therefore and a cost for rip-up and reroute of existing nets. Maze method with a score evaluation is described in a document titled "A Detailed Router Based on Incremental Routing Modifications: Mighty" (IEEE Transactions of Computer-Aided Design, Vol. CAD-6, 1987), presented by Youn-Long Lin et al.

In the method as mentioned above, evaluating of a score of a current net is conducted such that the score is incremented by a certain large amount when the current net passes a grid receiving therein a wire segment of another existing net, while the score is incremented by a small amount when the current net enters a grid receiving no wire segment of another net. In this method, the current net is routed, irrespective of existence of another net obstructing the current net, in a minimum-cost path providing a minimum-cost for the current net among possible paths for the current net, i.e., providing a lowest score of route thereby enabling an optimum route for the current net. If the current net is obstructed by an existing net in the minimum-cost path of the current net, the existing net is ripped-up and rerouted for allowing the current net to run along the minimum-cost path. The method is described, for example, in a document titled "SILK: A Simulated Evolution Router" (IEEE Transaction of Computer-Aided Design, 1989, pp. 1108–1114), presented by Hyunchul Shin et al.

SUMMARY OF THE INVENTION

It is an object of the present invention to provide a method for designing an interconnection route in an LSI consuming a less amount of time for routing thereby reducing the cost for the design of the LSI.

According to the present invention, there is provided a method for designing interconnection route in an LSI including steps of: selecting a current net among unrouted nets to be routed in a routing area represented by a matrix of a plurality of grids, each of the grids being assigned to a unit cost selected from a first cost and a second cost lower than the first cost; selecting a plurality of possible paths for the current net, each of the possible paths including a plurality of the segments each recieved in corresponding one of the grids; scoring a cost sum for each of the plurality of possible paths, the cost sum including each the unit cost for each of the grids receiving each of the path segments of the each of the plurality of paths, the first cost being assigned to one of the grids receiving a wire segment of a first existing net having no wire segment received in another of the grids receiving one of the path segments of the each of possible paths so far routed, the second cost being assigned to one of the grids receiving a wire segment of a second existing net having another wire segment received in another of the grids receiving one of the path segments of the each of possible paths so far routed; and selecting a minimum-cost path providing a minimum score of the cost sum among the possible paths.

BRIEF DESCRIPTION OF THE DRAWINGS

The above and other objects as well as features and advantages of the present invention will be more apparent from the following description, taken in conjunction with accompanying drawings in which.

DESCRIPTION OF PREFERRED EMBODIMENTS

Before describing preferred embodiments of the present invention, a conventional method and problems involved therein will be described for the sake of understanding of the present invention.

Figure 1:
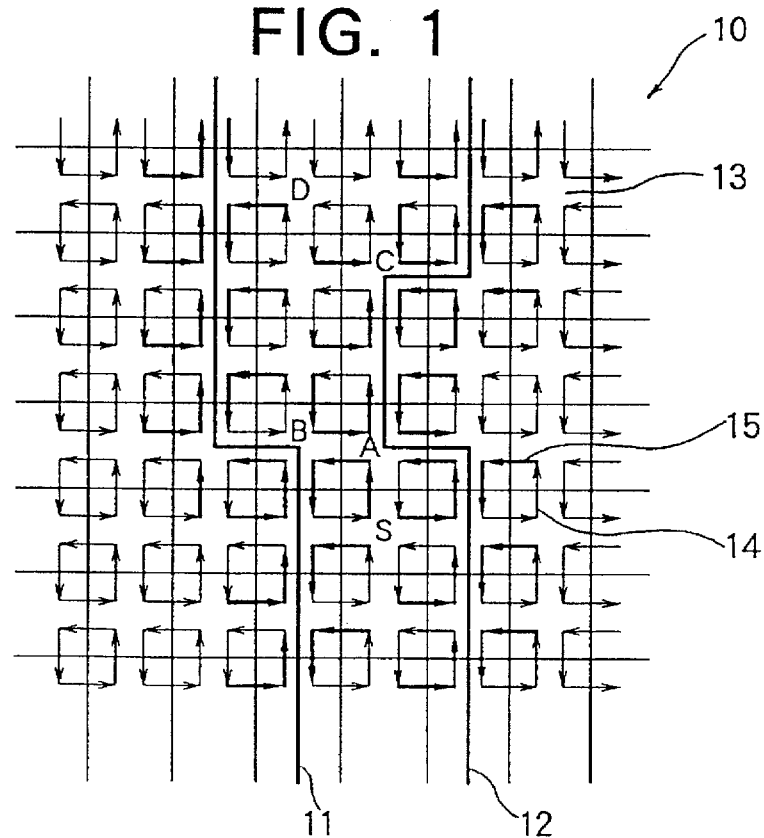
FIG. 1 is a schematic plan view of a routing area before routing a current net in the presence of existing nets.
Figure 2:
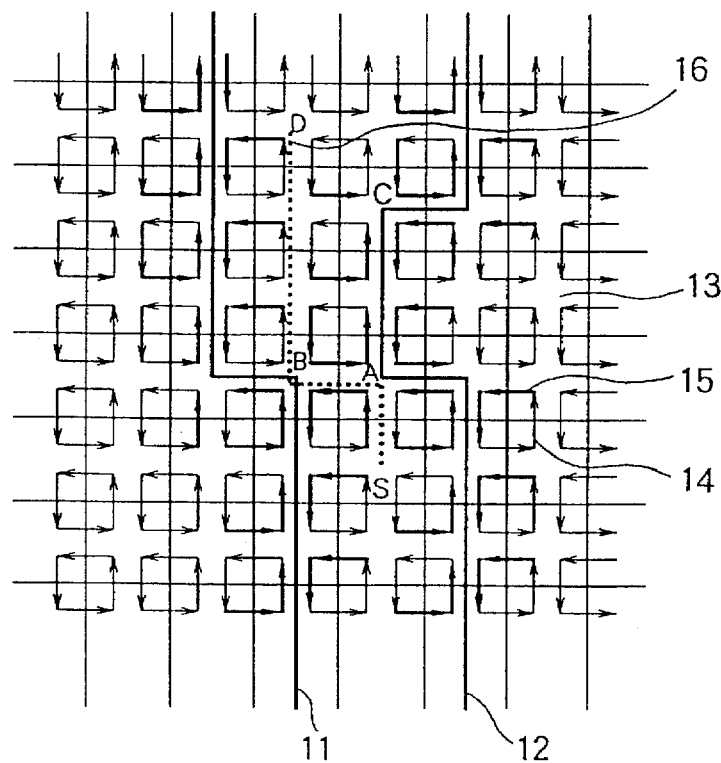
FIG. 2 is a schematic plan view of the routing area of FIG. 1 after selecting a minimum-cost path for the current net using a conventional method.

FIGS. 1 and 2 are schematic plan views of a routing area shown for describing a conventional routing procedure in designing an interconnection route in a VLSI or ULSI. FIGS. 1 and 2 show a routing area 10 before and after selecting a route for a current net, respectively, in the presence of existing nets including Net 11 and Net 12. The routing area 10 is represented by a matrix of a plurality of grids 13 each for receiving a single wire segment of a single net. Each of the grids 13 is constituted by an intersection of a plurality of column tracks and a plurality of row tracks. It is assumed that the current net is to be routed from Grid S to Grid D both receiving therein connecting pins or electrodes for the current net.

Between each adjacent two of the grids 13 in the routing area 10, there are shown thin arrows 14 and thick arrows 15. Each of the thin arrows 14 indicates a low cost assuming a cost value one representing a length cost to be added when a net advances one grid in the direction of the thin arrow 14. Each of the thick arrows 15 indicates a high cost assuming a cost value ten including the length cost and a rip-up and reroute cost. That is, the rip-up and reroute cost assumes a cost value nine, which is to be added to the length cost when a net advances in the direction of the thick arrow 15 to enter an adjacent grid receiving a wire segment of an existing net. Thus, for example, the score of the current net is incremented by ten when the current net advances one grid from Grid S upwards to Grid A receiving a wire segment of Net 12, and incremented also by ten when the current net further advances one grid from Grid A upwards.

There are a plurality of possible paths for the current net from Grid S to Grid D including a first path in which the current net advances from Grid S through grid A and Grid B to Grid D (S-A-B-D), and a second path in which the current net advances from Grid S through Grid A and Grid C to Grid D (S-A-C-D). The first path S-A-B-D amounts to a score 23 including five length costs and two rip-up and reroute costs, while the second path S-A-C-D amounts to a score 32 including five length costs and three rip-up and reroute costs. Therefore, the first path S-A-B-D for the current net as shown by a dotted line 16 in FIG. 2 is selected as a minimum-cost path among the possible paths from Grid S to Grid D while allowing overlapping with a wire segment of existing nets.

Figure 3:
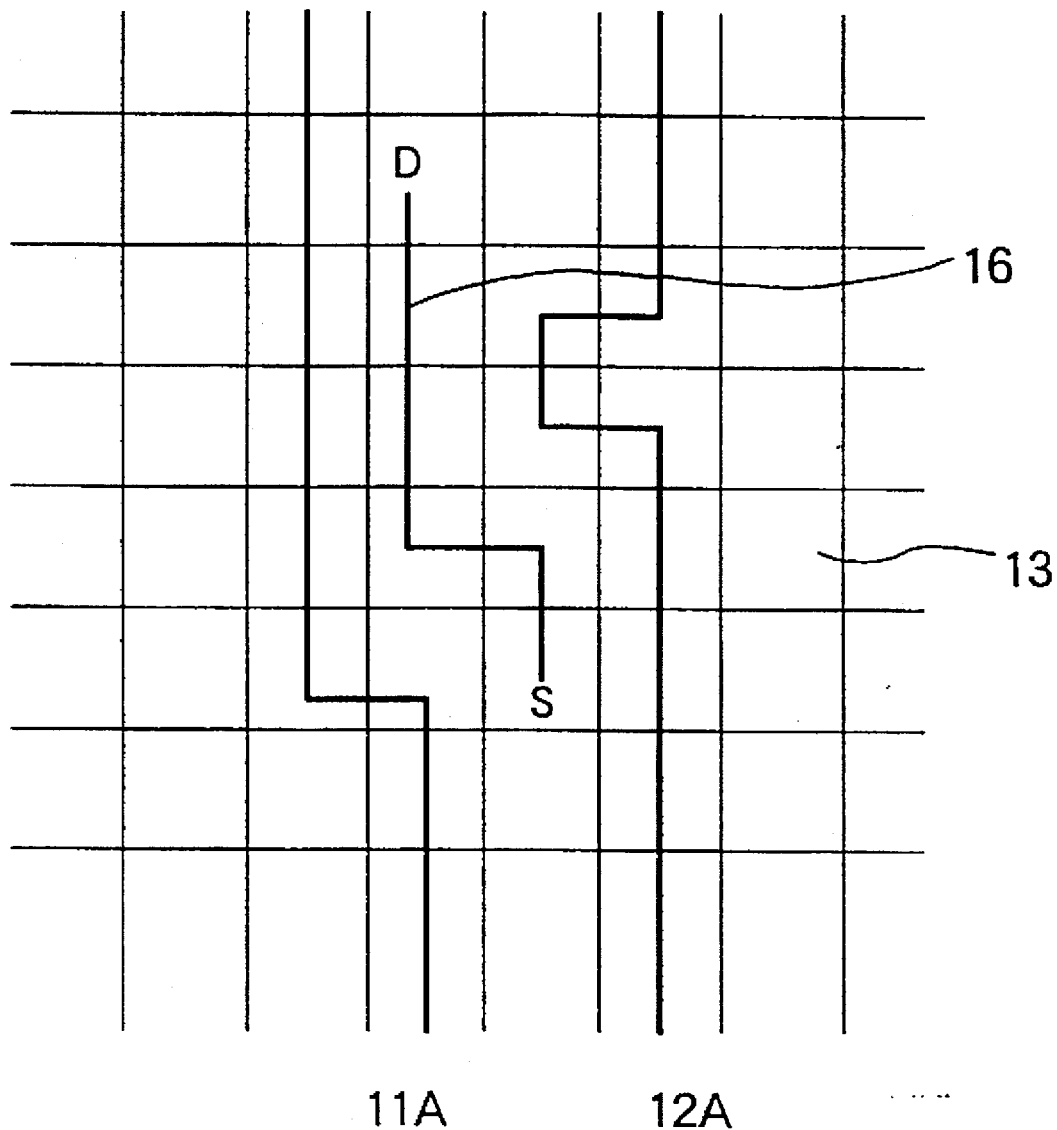
FIG. 3 is a schematic plan view of the routing area of FIG. 2 in a final aspect after rip-up and reroute procedure of the existing nets and routing of the current net using the conventional method.

In the case described above, however, Net 11 and Net 12 must be ripped-up and rerouted for allowing the current net to run along the second path S-A-B-D 16. The result of the rip-up and reroute of the existing nets and routing of the current net is illustrated in FIG. 3 as a final aspect of the interconnections, including the current net 16, and rerouted nets 11A and 12A.

In the conventional method as described above, the two existing nets, Net 11 and Net 12, are ripped-up and rerouted for allowing the current net to run along the minimum-cost path 16. As will be understood, it is likely to happen in the conventional method that a minimum-cost path for a current net is selected so that the current net overlaps with a single wire segment of each of a plurality of existing nets rather than with a several wire segments of a single existing net. In case of overlapping with a single wire segment of each of a plurality of existing nets, however, consumes a large amount of processing time in a routing computer for designing the interconnection route, because each of the plurality of existing nets is separately ripped-up and rerouted in the routing procedure of the routing computer. Accordingly, in the conventional method, a large amount of time may be consumed for the rip-up and reroute operation of the existing nets, resulting in a large amount of cost for designing the interconnection route.

Now a preferred embodiment of the present invention will be described with reference to the drawings.

Figure 4:
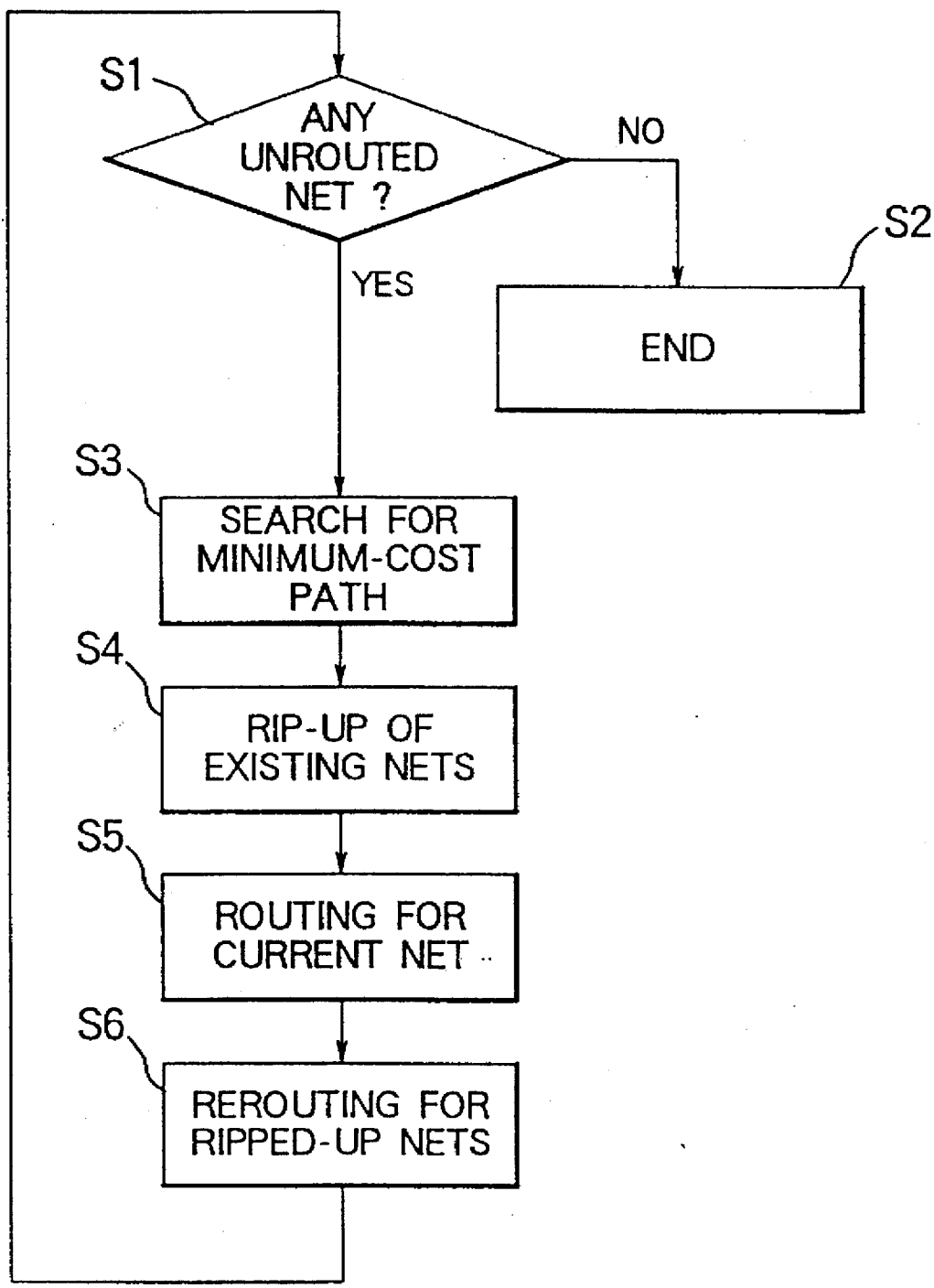
FIG. 4 is a flow-chart of a method for designing an interconnection route according to an embodiment of the present invention.

Referring to FIG. 4, there is shown a flow-chart of a method according to a preferred embodiment of the present invention. The flow-chart includes first step S1 through seventh step S7. In the first step S1, selecting of one of unrouted nets is conducted to designate a current net. If there is no unrouted net left, the flow goes to step S2 to end the routing process. After the current net is selected in the step S1, the routing procedure for the current net follows. First, searching step S3 for obtaining a minimum-cost path for the current net is conducted. In this step, a plurality of possible paths are selected first for the current net while allowing the current net to overlap with existing nets. Then, the cost for each of the possible paths is scored along the route to obtain a cost sum for the each of the possible paths. Subsequently, the minimum-cost path providing a minimum cost sum is selected among the possible paths for the current net.

Subsequently, rip-up step S4 is conducted for rip-up of the existing nets. Then, the current net is fixed in the selected minimum-cost path or a modified path obtained by modifying the selected minimum-cost path. The final step S6 is conducted after the fixing of the current net so as to reroute and fix the ripped-up existing nets. The flow then return to a first step S1 to operate a loop flow for routing all of the unrouted nets left. If no unrouted net is found in step S1, the step goes to the end step S2.

In the process as described above, the cost sum of each of the possible paths for the current net may include a first cost through a fourth cost. The first cost is scored when the current net running along one of the possible paths enters a grid receiving a wire segment of an existing nee which have no other wire segment thereof overlapping with a path segment of the one of the possible paths so far routed, i.e., before the current net running along the each of the possible paths enters the grid. The second cost is scored when the current net running along one of the possible paths enters a grid receiving a wire segment of an existing net which is stored in a memory as an overlapping existing net because another wire segment of the existing net is already found as overlapping with a path segment of the one of the possible paths so far routed. The third cost is scored when the current net advances one grid in each of layers of a multilayer interconnection, while the fourth cost is scored when the current net passes through a via-hole from a layer to an adjacent layer.

The second cost is set smaller than that of the first cost according to the principle of the present invention. The search for the optimum route of the current net is conducted so as to find a minimum-cost path among the possible paths, i.e. the path providing a minimum cost sum scored in the entire route of the current net.

In the step S5, the actual path of the current net is modified such that the number of bends in the selected path for the current net is lower than a predetermined number so as to find a better interconnection route simpler than the selected one. Such a modification is described in the document presented by Hyunchul et al. as mentioned before. If such a modification is not necessary, i.e. the bends of the path is not considered to degrade the quality of the interconnection, then the modification is not performed in the step S5 and the current net is merely fixed in the minimum-cost path selected in the step S3. In the step S6, the ripped-up existing nets are rerouted to allow the current net to run along the fixed path. The number of existing nets to be rerouted will be lower than or at least not higher than that of existing nets to be rerouted in the conventional method.

In short, the inventive feature of the present invention as compared to the conventional method resides in that the second cost is set lower than the first cost to thereby reduce the number of existing nets to be ripped-up and rerouted for allowing the current net to pass the then occupied grids. The feature will be described in detail with reference to FIGS. 5 through 7.

Figure 5:
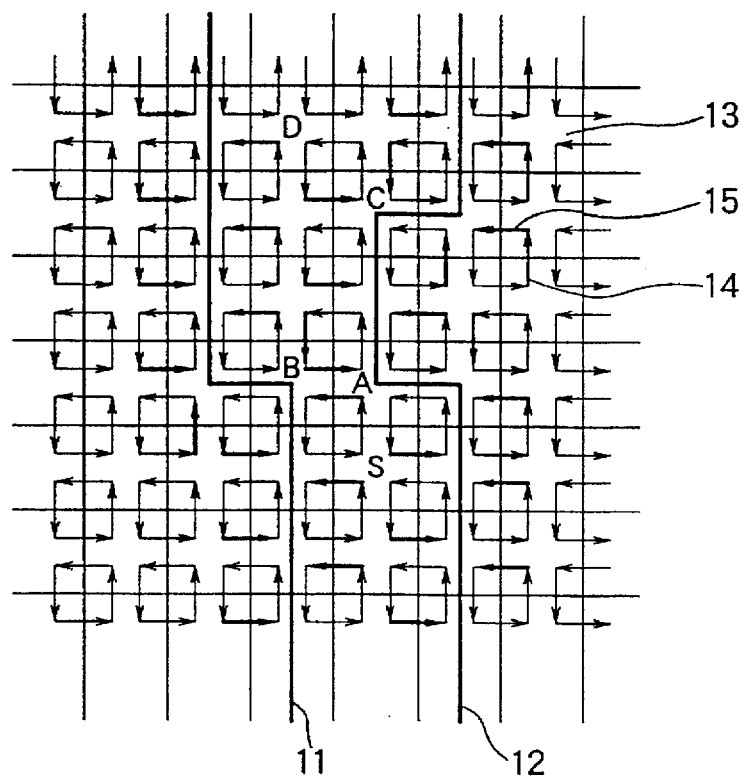
FIG. 5 is a schematic plan view of a routing area before routing a current net in the presence of existing nets using the method of FIG. 4.
Figure 6:
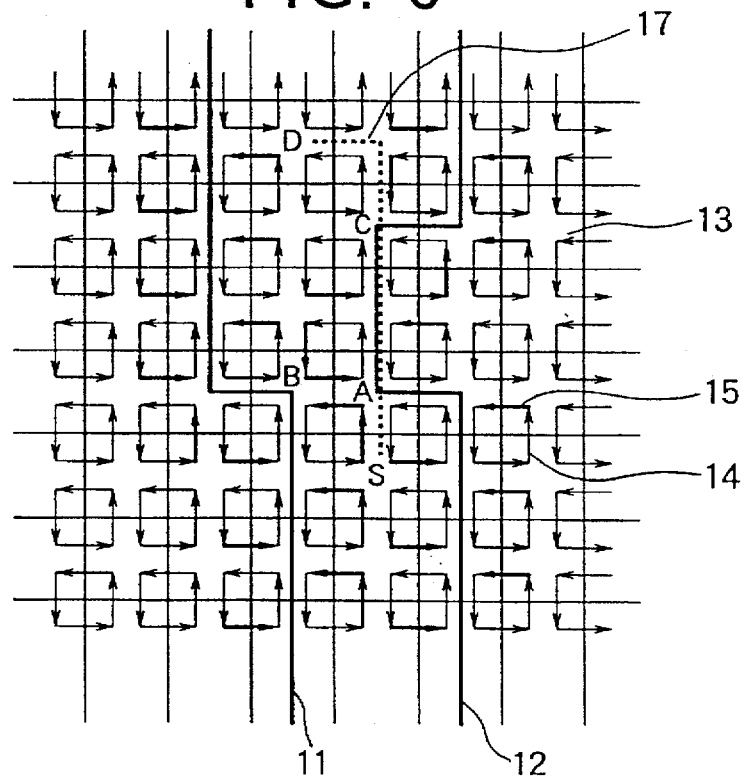
FIG. 6 is a schematic plan view of the routing area of FIG. 5 after selecting a minimum-cost path for the current net using the method of FIG. 4.

Consider that search of a minimum-cost path for a current net is to be performed in the routing region of FIG. 5 which has the same geometry as that of FIG. 1.

In FIG. 5, each of the arrows 14 and 15 indicates a cost for adjacent two of the grids similarly to the cost in FIG. 1. In other words, each of the thin arrows 14 represents a length cost and each of the thick arrows 15 represents a combination of a length cost and a rip-up and reroute cost assigned to the destination grid of the adjacent two grids. The thin arrow 14 represents a cost having a cost value one while the thick arrow 15 represents a cost having a cost value ten in this embodiment. Hence, if the current net running along one of the possible paths enters from a grid to an adjacent grid receiving a wire segment of an existing net having no other wire segment overlapping with the current net so far routed in the routing procedure of the one of the possible paths, the score for the one of the possible paths is added by ten. However, the rip-up and reroute cost is not added to the length cost, if the current net running along one of the possible paths enters a grid receiving a wire segment of an existing net which is found as overlapping with the current net in another grid during the current routing procedure of the one of the possible paths so far conducted, i.e. before the current net enters the grid.

In FIG. 5, when the current net running along one of the possible paths advances from Grid S one grid upwards to Grid A in the routing procedure, the score of the current net assumes ten due to the existence of Net 12. When the current net further advances from Grid A one grid upwards, the score of the current net is added by one, i.e., a length cost as indicated by a thin arrow 14. It is because the current net merely overlaps with Net 12 already overlapped with the current net and is therefore to be ripped-up and rerouted irrespective of overlapping with Net 12 in the destination grid.

In a similar manner, the cost of the current net running along each of the possible path is counted so that the cost sum of the current net amounts to 23 in a first path from Grid S through Grid A and Grid B to Grid D (S-A-B-D), while the cost sum of the current net amounts to 14 in a second path from Grid S through Grid A and Grid C to Grid D (S-A-C-D). Therefore, the second path 17 is selected as a minimum-cost path among the possible paths for the current net. To allow the current net to pass the second path 17 as shown by dotted line in FIG. 6, it is sufficient to rip-up and reroute only one net, i.e., Net 12.

Figure 7:
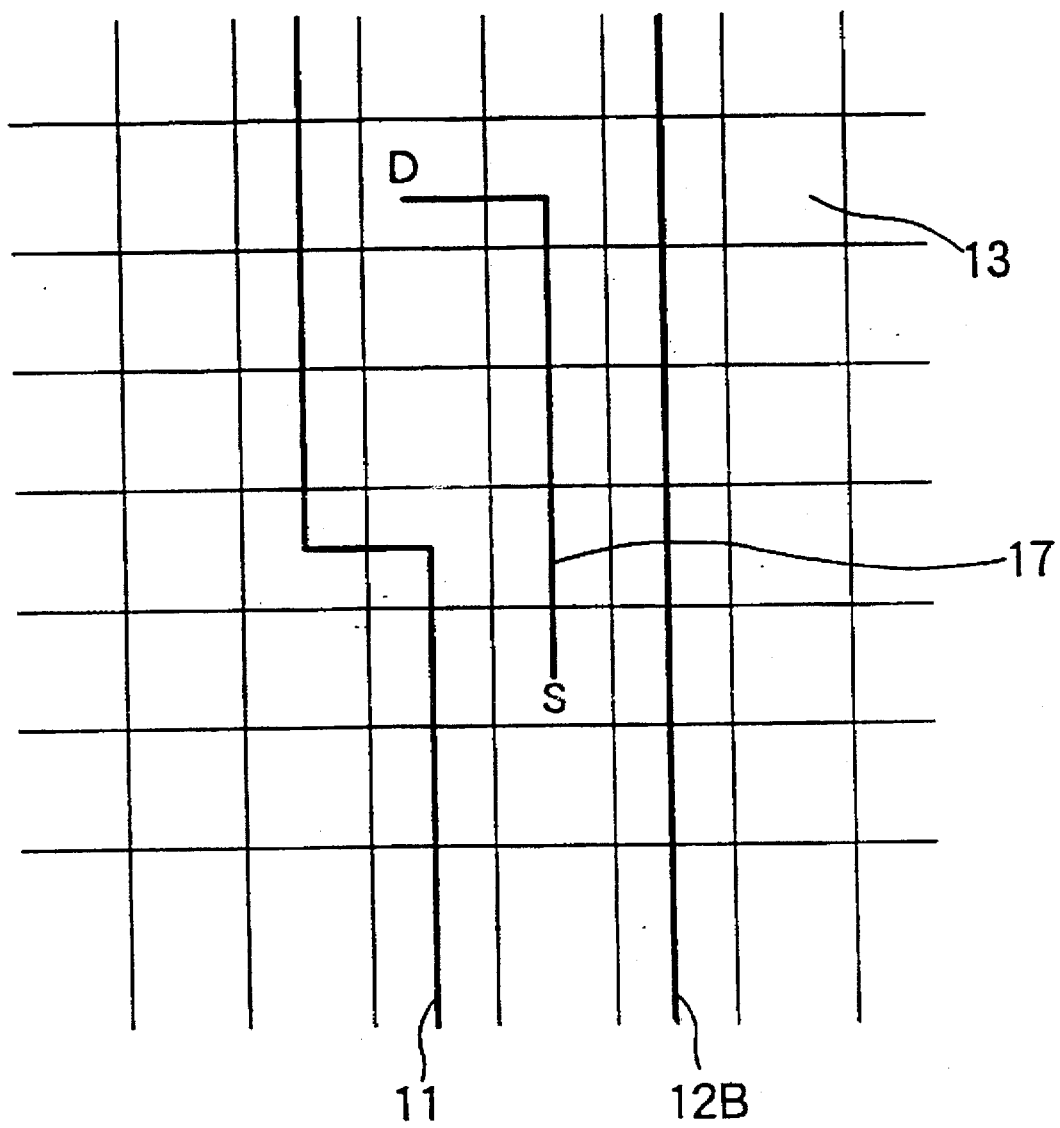
FIG. 7 is a schematic plan view of the routing area of FIGS. 5 and 6 after rip-up and reroute of the existing nets and routing of the current net using the method of FIG. 4.

FIG. 7 shows the final aspect of the routing area obtained by rip-up and reroute of Net 12 to obtain a modified existing net 12B and by fixing the current net 17 in the selected minimum path. Thus, routing of the current net is finished and another current net is selected to process routing of next unrouted net.

In accordance with the present embodiment, a smaller number of existing nets will be ripped-up and rerouted so that the routing procedure consumes a less amount of time. For example, suppose that 500 unrouted nets are to be routed according to the present embodiment in which an average of a single existing net is ripped-up and rerouted as compared to the conventional method in which an average of two existing nets is ripped-up and rerouted, and suppose that routing or rerouting procedure of each of the nets consumes one second in a routing computer. The conventional method consumes 500×3×1=1500 seconds, while the present method consumes only 500×2×1=1000 seconds, resulting in a reduction of 500 seconds as compared to the conventional method.

In the embodiment as described above, the second cost is selected as a value zero. However, the second cost can be any value insofar as the second cost is lower than the first cost. Similarly, the first cost may be selected at any cost set in balance with the third cost (first length cost) and the fourth cost (second length cost). For example, the second cost can be selected while considering the amount of time required to reroute an existing net.

Although the present invention is described with reference to the preferred embodiments, the present invention is not limited to such embodiments and it will be obvious for those skilled in the art that various modifications or alterations can be easily made based on the above embodiments within the scope of the present invention.

What is claimed is:

1. A method for designing an interconnection route for a net within an LSI represented by a matrix of grids, each of said grids being assigned a unit cost, said interconnection route being designed based on costs corresponding to a plurality of possible paths, and comprising the steps of:

a) selecting the plurality of possible paths for said net, each of said possible paths including a plurality of path segments, each path segment corresponding to one of said grids;

b) for each path, summing costs corresponding to each segment within the path, the cost of each segment being associated with the corresponding grid, the cost associated with each grid being one of a largest, an intermediate and a smallest cost, the smallest cost being associated with empty grids that have not previously received a wire segment from another net, the largest cost being associated with grids that have previously received a wire segment from another net and wherein the other net does not intersect a segment of the path at another grid, such that at such largest cost grids the possible path is for a first time intersecting with the other net, the intermediate cost being associated with grids that have previously received a wire segment from another net and wherein the other net intersects a segment of the path at another grid, such that at such intermediate cost grids the possible path is not for a first time intersecting with the other net; and c) selecting as said interconnection route for the net, the path having a lowest summed cost among said possible paths.

2. A method for designing an interconnection route for an LSI as defined in claim 1, wherein said intermediate cost consists of said length cost.

3. A method for designing an interconnection route for an LSI as defined in claim 1 wherein each of said largest cost intermediate cost and smallest cost include therein a length cost representing the length of each of said path segments.

4. A method for designing an interconnection route for an LSI as defined in claim 3 wherein said smallest cost consists of said length cost.

5. A method for designing an interconnection route for an LSI as defined in claim 1 wherein said intermediate cost is equal to said smallest cost.

6. A method for designing an interconnection route in an interconnection routing area represented by a matrix of a plurality of grids, said method finding an optimum path for a current net extending from a first grid to a second grid, said method including the steps of designating a plurality of possible paths for said current net from said first grid to said second grid, calculating a cost sum for each of said plurality of possible paths by scoring the following costs when said current net advances from a current grid to a next grid between said first grid and said second grid:

a first cost if said current grid is not occupied by a wire segment of a first existing net and said next grid is occupied by a wire segment of said first existing net a second cost if said current grid is occupied by a wire segment of a second existing net and said next grid is occupied by another wire segment of said second existing net, said second cost being smaller than said first cost, said first and second existing nets being routed before routing of said current net; and a third cost each time when said current net advances from said current arid to said next grid;

comparing said cost sums of said plurality of possible paths, selecting a first route for said current net as said optimum route, said first route providing the minimum cost sum among said cost sums of said plurality of possible paths, and ripping-up and re-routing said first existing net and said second existing net, if any, to circumvent the grids occupied by said current net extending along said first route.

7. A method as defined in claim 6 wherein said second cost is zero, and said first cost is greater than zero.

8. A method as defined in claim 6, wherein said second cost is directly related to an amount of time required to reroute said second existing net so as not to interfere with said current net.

* * * * *